(12) United States Patent
Chhabra et al.

(10) Patent No.: US 11,114,154 B2
(45) Date of Patent: Sep. 7, 2021

(54) VOLTAGE RETENTION TECHNIQUES

(71) Applicant: Arm Limited, Cambridge (GB)

(72) Inventors: Amit Chhabra, Noida (IN); Shanuj Garg, Noida (IN)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/716,903

(22) Filed: Dec. 17, 2019

(65) Prior Publication Data

US 2021/0183436 A1    Jun. 17, 2021

(51) Int. Cl.
*G11C 11/417* (2006.01)
*G11C 5/14* (2006.01)
*G11C 11/406* (2006.01)
*H03F 1/30* (2006.01)

(52) U.S. Cl.
CPC .......... *G11C 11/417* (2013.01); *G11C 5/147* (2013.01); *G11C 11/40626* (2013.01); *H03F 1/303* (2013.01)

(58) Field of Classification Search
CPC ... G11C 7/04; G11C 11/40626; G11C 11/417; G11C 5/147
See application file for complete search history.

(56) References Cited

U.S. PATENT DOCUMENTS

| | | | |
|---|---|---|---|
| 8,509,008 B2* | 8/2013 | Lee | G11C 7/04 365/189.09 |
| 9,792,979 B1* | 10/2017 | Dreesen | G11C 11/412 |
| 9,922,699 B1* | 3/2018 | Sinangil | G11C 11/419 |

* cited by examiner

*Primary Examiner* — Ajay Ojha
(74) *Attorney, Agent, or Firm* — Pramudji Law Group PLLC; Ari Pramudji

(57) ABSTRACT

Various implementations described herein are directed to a device having voltage generator circuitry that provides a temperature-compensated voltage. The device may include amplifier circuitry that receives the temperature-compensated voltage from the voltage generator circuitry and provides an output voltage based on the temperature-compensated voltage. The device may include voltage retention circuitry that receives the output voltage from the amplifier circuitry and provides a retention voltage to memory based on the output voltage.

19 Claims, 11 Drawing Sheets

VOLTAGE RETENTION TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Typically, a large memory array has multiple bitcell devices. In some cases, there is a need to keep a memory array in retention when there are no read and write operations being performed. For this purpose, the voltage at which the memory array can retain data is referred to as retention voltage, and the retention voltage may be a function of temperature. In some cases, retention voltage is highest at cold temperatures, and it can reduce as temperature reaches ambient temperature. The memory circuitry should ensure that memory retention is respected at cold temperatures. Thus, there is a need to have a temperature compensated retention voltage for memory arrays.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to voltage retention schemes and techniques. For instance, the various schemes and techniques described herein may provide for a system of mechanisms that are used for temperature-compensated voltage generation for memory retention. In some implementations, the schemes and techniques described herein may be configured to provide for a system or device that includes voltage generation circuitry and voltage retention circuitry. For instance, the various schemes and techniques described herein may provide for voltage generation and retention architecture that is configured to provide temperature-compensated internal voltage for static random access memory (SRAM) bitcell retention.

Various implementations of voltage generation and retention techniques will be described in detail herein with reference to FIGS. 1-6.

Figure 1:
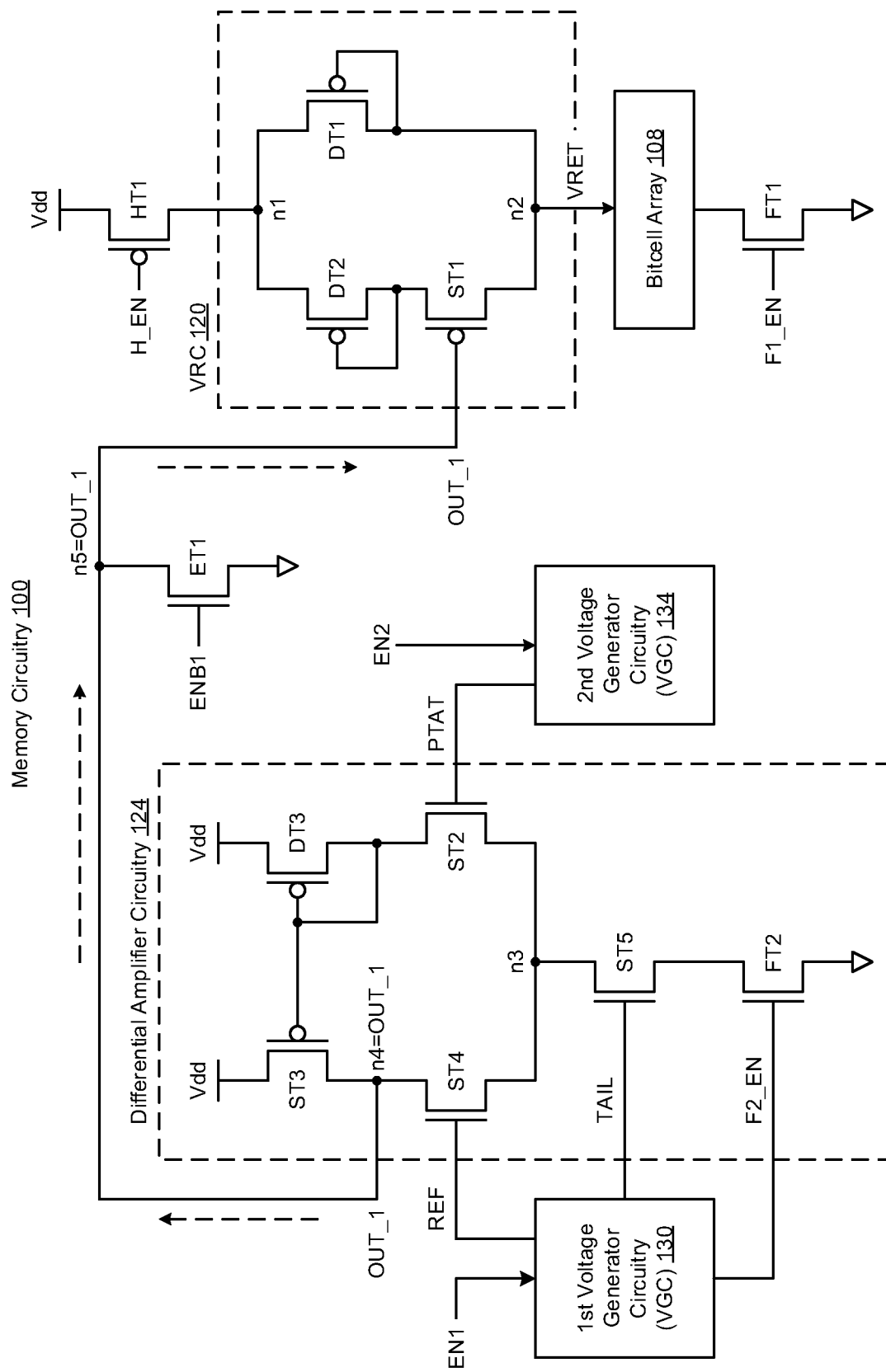
FIG. 1 illustrates a diagram of memory with voltage generation circuitry and voltage retention circuitry in accordance with implementations described herein.

FIG. 1 illustrates a diagram of memory circuitry 100 having voltage generation circuitry (VGC) 130, 134, amplifier circuitry 124, and voltage retention circuitry (VRC) 120 in accordance with various implementations described herein.

In various implementations, the memory circuitry 100 may be implemented as a system or a device having various integrated circuit (IC) components that are arranged and coupled together as an assemblage or combination of parts that provide for a physical circuit design and related structures. In some instances, a method of designing, providing and building the memory circuitry 100 as an integrated system or device that may involve use of various IC circuit components described herein so as to thereby implement voltage retention schemes and techniques associated therewith. The memory circuitry 100 may be integrated with computing circuitry and related components on a single chip, and the memory circuitry 100 may be implemented in various embedded systems for electronic, mobile and Internet-of-things (IoT) applications, including sensor nodes.

As shown in FIG. 1, the memory circuitry 100 may include voltage generator circuitry (VGC) 130, 134 that provides a temperature-compensated voltage (PTAT) based on one or more enable signals (EN1, EN2). The voltage generator circuitry (VGC) may include first voltage generator circuitry (VGC) 130 that is enabled with a first enable signal (EN1) and second voltage generator circuitry (VGC) 134 that is enabled with a second enable signal (EN2). The first voltage generator circuitry (VGC) 130 may be configured to provide one or more voltages, including, e.g., a reference voltage (REF), a tail voltage (TAIL), and a footer enable voltage signal (F2_EN), based on the enable signal (EN1). The second voltage generator circuitry (VGC) 134 may be configured to provide one or more voltages, including, e.g., the temperature-compensated voltage (PTAT), which may be referred to as a, e.g., proportional to absolute temperature voltage (PTAT), based on the enable signal (EN2). In various instances, the first VGC 130 and the second VGC 134 may be implemented as separate circuits or combined into a single circuit.

The memory circuitry 100 may include amplifier circuitry 124 that is arranged and configured to receive the temperature-compensated voltage (PTAT) from the voltage generator circuitry (VGC) 130, 134 and provide an output voltage (OUT_1) based on the temperature-compensated voltage (PTAT). In some instances, the amplifier circuitry 124 may refer to differential amplifier circuitry (DAC) having multiple devices including, e.g., a first device enabled by the temperature-compensated voltage (PTAT), a second device enabled by the reference voltage (REF), and a third device enabled by the tail voltage (TAIL). In some instances, during operation, the first device, the second device, and the third device may be arranged and configured to provide the output voltage (OUT_1) when enabled by the temperature-compensated voltage (PTAT), the reference voltage (REF), and the tail voltage (TAIL), respectively.

The memory circuitry 100 may include voltage retention circuitry (VRC) 120 that receives the output voltage (OUT_1) from the amplifier circuitry 124 and provides a retention voltage (VRET) to memory 108 based on the output voltage (OUT_1). In some instances, the voltage retention circuitry (VRC) 120 may have multiple devices, including, e.g., a first switch device (ST1) that may be enabled by the output voltage (OUT_1) and that may provide the retention voltage (VRET) to the memory 108 based on the output voltage (OUT_1). In some instances, the memory 108 may refer to static random access memory (SRAM) having an array of SRAM bitcells, i.e., an SRAM bitcell array.

In some implementations, the first voltage generator circuitry (VGC) 130 may include a chain of fixed length devices that are arranged and configured to provide the reference voltage (REF). In this instance, the chain of fixed length devices may be referred to as a chain of small (or short) length devices, wherein the chain of fixed length devices have a narrow length (or shortened length, or reduced length, or shortened length). Also, the amplifier circuitry 124 may be configured to receive the reference voltage (REF) from the chain of fixed length devices and provide the output voltage (OUT 1) based on the temperature-compensated voltage (PTAT) and the reference voltage (REF). In some instances, the chain of fixed length devices may be arranged and configured to provide the tail voltage (TAIL), and the amplifier circuitry 124 may be configured to receive the tail voltage (TAIL) from the chain of fixed length devices and provide the output voltage (OUT_1) based on the temperature-compensated voltage (PTAT), the reference voltage (REF), and/or the tail voltage (TAIL).

In some implementations, the second voltage generator circuitry (VGC) 134 may include a chain of variable length devices that are arranged and configured to provide the temperature-compensated voltage (PTAT). Sometimes, the length of the devices may be substantially large where the sub-threshold leakage of the device becomes comparable to the reverse bias leakage from the drain to the bulk of the device. The chain of variable length devices may have variable width that tapers from a greater width device to a lessor width device with a number of intermediate width devices coupled between the greater width device and the lessor width device. Also, in some instances, the temperature-compensated voltage provided by the chain of variable length devices may refer to the proportional to absolute temperature (PTAT) voltage.

In some implementations, the voltage retention circuitry (VRC) 120 may include multiple devices arranged and adapted to assist with voltage retention. For instance, the VRC 120 may include a header device (HT1), one or more diode devices (DT1, DT2), and a footer device (FT1). The header device (HT1) may be coupled to the VRC 120 between a voltage supply source (Vdd) and the diode devices (DT1, DT2) at node (n1), and also, the header device (HT1) may be implemented with a P-type transistor that is activated by a header enable signal (H_EN). The diode devices (DT1, DT2) may include a first diode device (DT1) that is coupled between the header device (HT1) at node (n1) and the bitcell array 108 at node (n2), and also, the first diode device (DT1) may be implemented with a P-type transistor that is coupled together to operate as a diode. The diode devices (DT1, DT2) may include a second diode device (DT2) that is coupled between the header device (HT1) at node (n1) and the first switch device (ST1), and also, the second diode device (DT2) may be implemented with a P-type transistor that is coupled together to operate as a diode. The first switch device (ST1) may be coupled between the second diode device (DT2) and the bitcell array 108 at node (n2), and also, the first switch device (ST1) may be implemented with a P-type transistor that is activated with the output voltage (OUT_1) provided by the amplifier circuitry 124. The bitcell array 108 may be coupled between the first switch device (ST1) at node (n2) and the footer device (FT1). The footer device (FT1) may be coupled between the bitcell array 108 and a log_0 voltage supply, such as, e.g., ground supply (Gnd or Vss), and also, the footer device (FT1) may be implemented with an N-type transistor that is activated by a first footer enable signal (F1_EN).

In some implementations, the amplifier circuitry 124 may be adapted to operate as differential amplifier circuitry (DAC), and the DAC 124 may include multiple devices that are arranged and adapted to assist with providing the output voltage (OUT 1). For instance, the DAC 124 may include a diode device (DT3), switch devices (ST2, ST3, ST4, ST5), and a footer device (FT2). The diode device (DT3) may be coupled between the voltage supply source (Vdd) and a second switch device (ST2), and also, the third diode device (DT3) may be implemented with a P-type transistor that is coupled together to operate as a diode. The switch devices may include the second switch device (ST2) that is coupled between the third diode device (DT3) and a fifth switch device (ST5) at node (n3), and also, the second switch device (ST2) may be implemented with an N-type transistor that is activated by the PTAT voltage, which is provided by the second VGC 134. The switch devices may include the third switch device (ST3) that is coupled between the voltage supply source (Vdd) and a fourth switch device (ST4) at node (n4), and also, the third switch device (ST3) may be implemented with a P-type transistor that is activated by an output of the third diode device (DT3). The switch devices may include the fourth switch device (ST4) that is coupled between the third switch device (ST3) at node (n4) and the fifth switch device (ST5) at node (n3), and also, the fourth switch device (ST4) may be implemented with an N-type transistor that is activated by the REF voltage, which is provided by the first VGC 130. The switch devices may include the fifth switch device (ST5) that is coupled between the second switch device (ST2) at node (n3) and the footer device (FT2), and the fifth switch device (ST5) may be implemented with an N-type transistor that is activated by the TAIL voltage, which is provided by the first VGC 130. In addition, the footer device (FT2) may be coupled between the fifth switch device (ST5) and the log_0 voltage supply, such as, e.g., ground supply (Gnd or Vss), and also, the footer device (FT2) may be implemented with an N-type transistor that is activated by a second footer enable signal (F2_EN).

In some implementations, the memory circuitry 100 may also include an enable device (ET1) that is coupled between the differential amplifier circuitry (DAC) 124 and the voltage retention circuitry (VRC) 120. As shown in FIG. 1, an output of the DAC 124 at node (n4) may be coupled directly to an input of the VRC 120 at the gate of the first switch device (ST1). Also, the enable device (ET1) may be coupled to node (n5) that is the same node as node (n4), which is coupled to the gate of the first switch device (ST1). Also, the enable device (ET1) may be coupled between the node (n5) and the log_0 voltage supply, such as, e.g., ground supply (Gnd or Vss), and in addition, the enable device (ET1) may be implemented with an N-type transistor that is activated by an enable signal (ENB1). As such, the output voltage (OUT_1) is provided by the DAC 124 via node (n4) to the enable transistor (ET1) and also to the VRC 120. In some instances, H_EN may be equal to Vdd, when powering down the memory array 108. For normal read/write operation and during retention, H_EN=0, and F1_EN is the same as H_EN, with opposite polarity. F1_EN=0 refers to powering down the memory array 108. F1_EN=Vdd for read/write and retention. F2_EN is used to enable the DAC 124, and ENB1 is the opposite of F2_EN. When DAC 124 is OFF, F2_EN=0 and ENB1=1, and in this instance, OUT_1 is held to Vss through ET1. Both diodes DT1 and DT2 are in action as the switch ST1 is fully on. In addition, EN1 pin is coupled to 130 and EN2 is coupled to 134. Also, 134 is coupled to F2_EN.

Figure 2A:
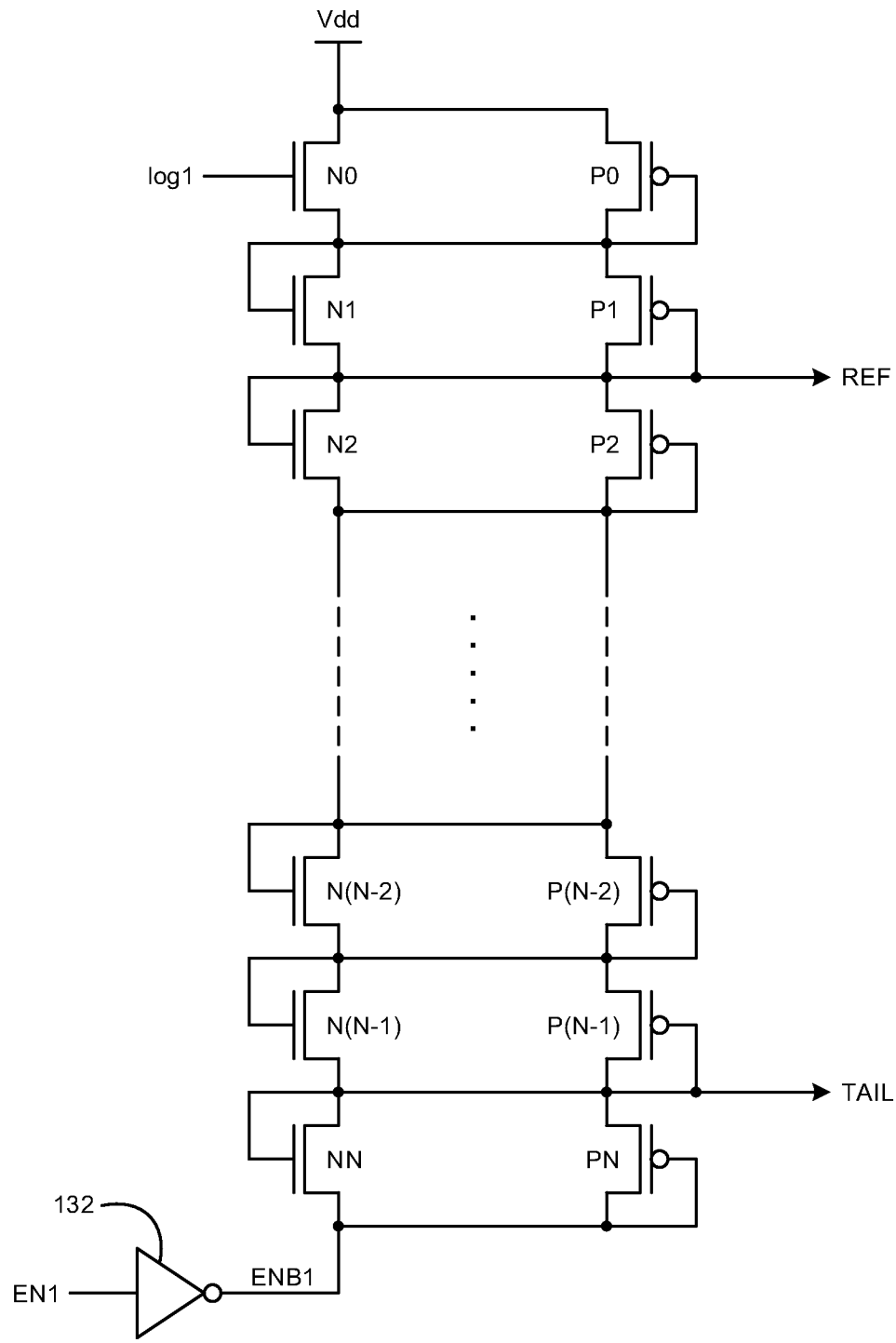
FIGS. 2A-2D illustrate diagrams of voltage generation circuitry and multiplexer circuitry in accordance with various implementations described herein.
Figure 2B:
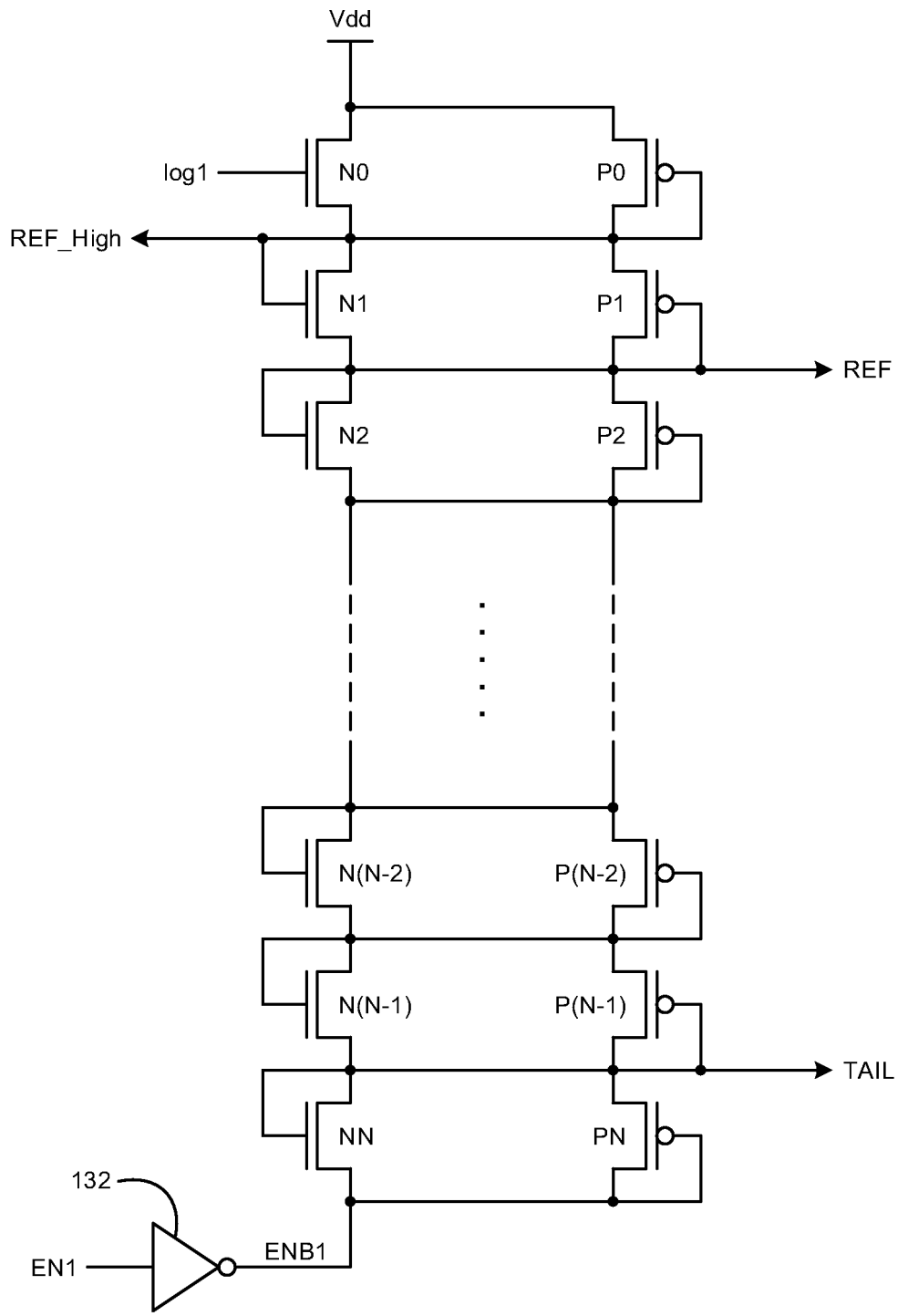
Figure 2C:
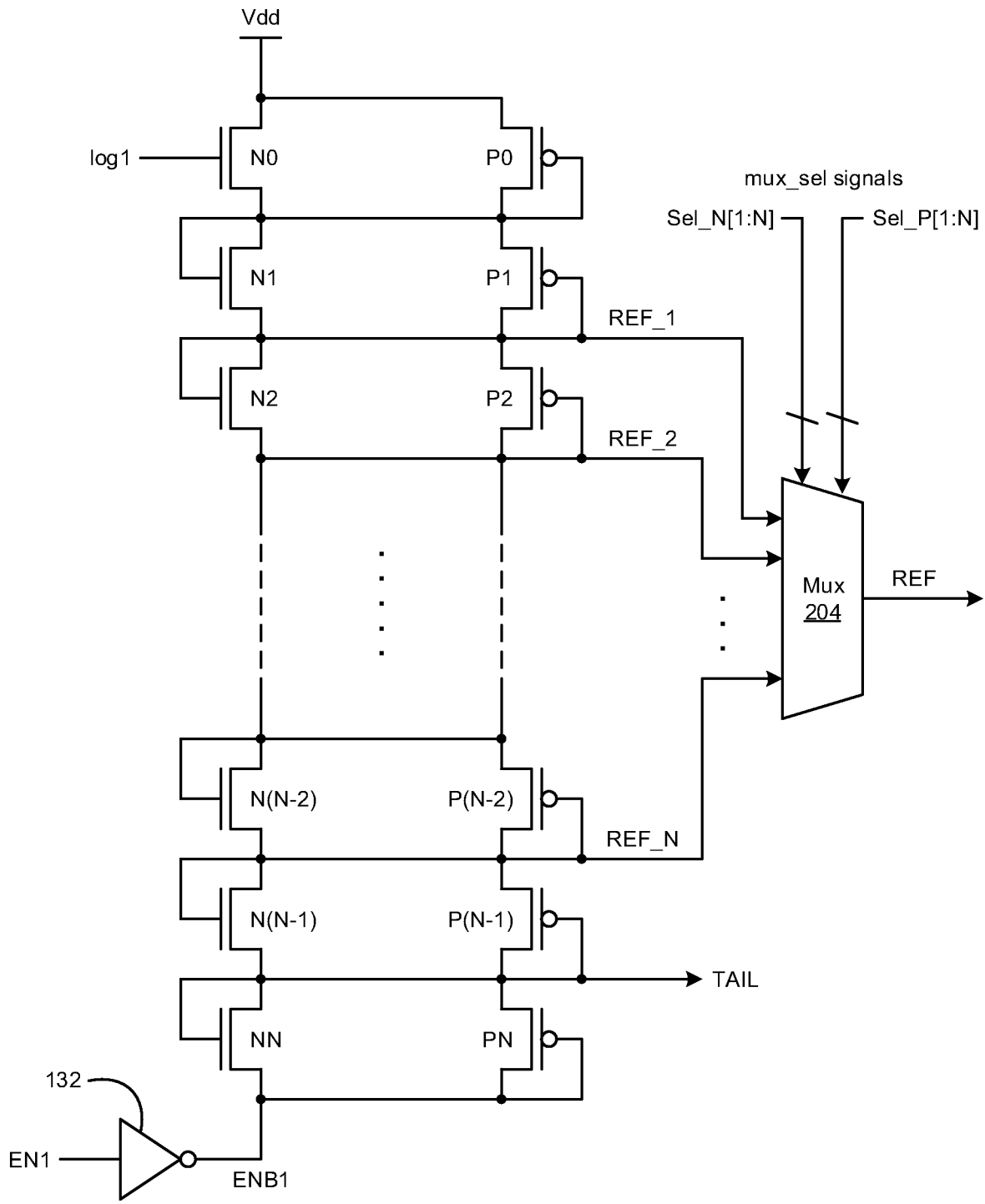
Figure 2D:
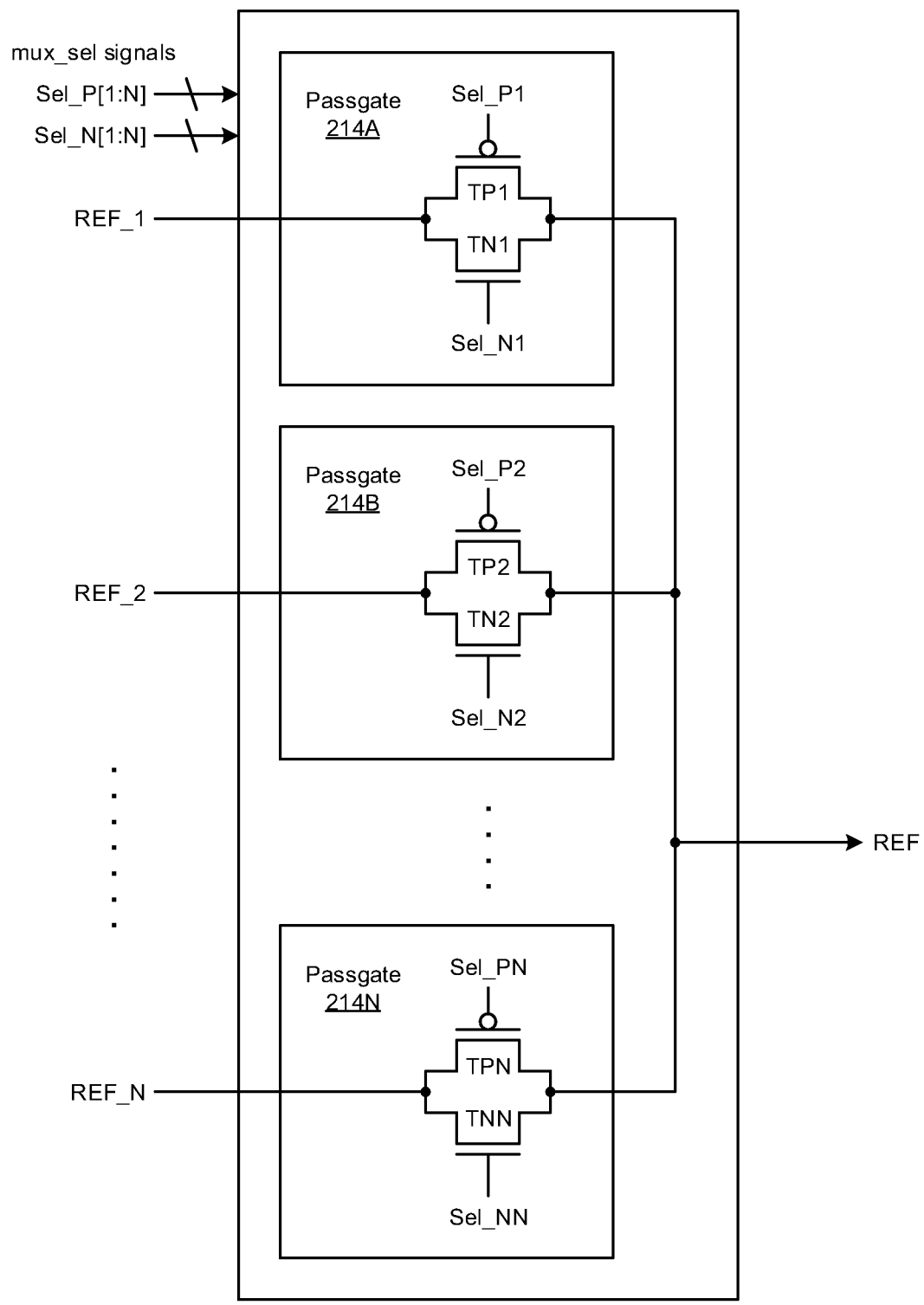

FIGS. 2A-2D illustrate various diagrams of the voltage generation circuitry 130 along with multiplexer circuitry 204 in accordance with various implementations described herein. In particular, FIG. 2A shows a first diagram 130A of the first voltage generator circuitry 130, FIG. 2B shows a second diagram 130B of the first voltage generator circuitry 130, FIG. 2C shows a third diagram 130C of the first voltage generator circuitry 130, and FIG. 2D shows a diagram of multiplexer circuitry (Mux) 204.

As shown in FIG. 2A, the first voltage generator circuitry 130 may include a chain of fixed length devices (N0/P0, N1/P1, N2/P2, . . . , NN/PN) that are arranged and configured to provide the reference voltage (REF) and/or the tail voltage (TAIL). In some instances, the chain of fixed length devices (N0/P0, N1/P1, N2/P2, . . . , NN/PN) include a first stack of N-type transistors (N0, N1, N2, . . . , N(N−2), N(N−1), NN) that are coupled between the voltage supply source (Vdd) and a buffer 132, which may be implemented with an inverter device. Also, in some instances, the chain of fixed length devices (N0/P0, N1/P1, N2/P2, . . . , NN/PN) include a second stack of P-type transistors (P0, P1, P2, . . . , P(N−2), P(N−1), PN) that are coupled between the voltage supply source (Vdd) and the buffer 132. The first stack of N-type transistors (N0, N1, N2, . . . , N(N−2), N(N−1), NN) may be coupled in parallel with corresponding devices of the second stack of P-type transistors (P0, P1, P2, . . . , P(N−2), P(N−1), PN).

In some instances, a first transistor (N0) of the first stack of N-type transistors (N0, N1, N2, . . . , N(N−2), N(N−1), NN) may be activated with a log_1 voltage signal (e.g., >0V), and the remaining N-type transistors (N1, N2, . . . , N(N−2), N(N−1), NN) may be coupled to operate as diodes. Also, in this instance, the second stack of P-type transistors (P0, P1, P2, . . . , P(N−2), P(N−1), PN) may be coupled to operate as diodes. Also, the enable signal (EN1) may be provided to the buffer 132, and the buffer 132 (or inverter) may provide an inverted enable signal (ENB1).

In some instances, as shown in FIG. 2A, the reference voltage (REF) may be taken as an output from a second transistor (P1) of the second stack of P-type transistors (P0, P1, P2, . . . , P(N−2), P(N−1), PN). Also, in some instances, the tail voltage (TAIL) may be taken as an output from a second-to-last transistor (P(N−1)) of the second stack of P-type transistors (P0, P1, P2, . . . , P(N−2), P(N−1), PN).

In some instances, as shown in FIG. 2B, the first voltage generator circuitry 130 may be tapped for one or more other output voltages, such as, e.g., a high reference voltage (REF_high). For instance, the high reference voltage (REF_high) may be taken as an output from the first transistor (N0) of the first stack of N-type transistors (N0, N1, N2, . . . , N(N−2), N(N−1), NN).

In some instances, as shown in FIG. 2C, the first voltage generator circuitry 130 may be tapped for multiple reference voltages (REF), such as, e.g., (REF_1, REF_2, . . . REF_N), that are applied to a multiplexer (Mux) 204. For instance, a first reference voltage (REF_1) may be taken as an output from the second transistor (P1) of the second stack of P-type transistors (P0, P1, P2, . . . , P(N−2), P(N−1), PN). Also, a second reference voltage (REF_2) may be taken as an output from the third transistor (P2) of the second stack of P-type transistors (P0, P1, P2, . . . , P(N−2), P(N−1), PN). Further, the remaining reference voltages (e.g., after REF_2 and up to REF_N) may be taken as an output from the corresponding transistors (e.g., after P2 and up to second-to-last transistor P(N−2)) of the second stack of P-type transistors (P0, P1, P2, . . . , P(N−2), P(N−1), PN). In addition, as shown in FIG. 2C, the multiple reference voltages (REF_1, REF_2, . . . REF_N) may be applied as multiple inputs to the Mux 204, and the Mux 204 may provide the reference voltage (REF) as output based on multiplexer select signals (mux_sel). For instance, the mux_sel signals may include a number (N) of first mux_sel signals (Sel_N[1:N]) and also a number of (N) second mux_sel signals (Sel_P[1:N]).

As shown in FIG. 2D, the multiplexer circuitry (Mux) 204 may include multiple passgate devices (214A, 214B, . . . , 214N) that are arranged and configured to receive corresponding reference signals (REF_1, REF_2, . . . , REF_N) and provide the reference signal (REF) based on corresponding mux_sel signals (Sel_P0/Sel_N0, Sel_P0/Sel_N0, . . . , Sel_PN/Sel_NN). In various instances, the select signals may be implemented with the multiplexer select signal (mux_sel) of FIG. 2C. The passgate devices (214A, 214B, . . . , 214N) may include multiple transistors that are coupled in parallel. In some instances, a first passgate device 214A may include a first P-type transistor (TP0) coupled in parallel with a first N-type transistor (TN0). Also, a second passgate device 214B may include a second P-type transistor (TP1) coupled in parallel with a second N-type transistor (TN1). In addition, a last passgate device 214N may include another P-type transistor (TPN) coupled in parallel with another N-type transistor (TNN).

Figure 3:
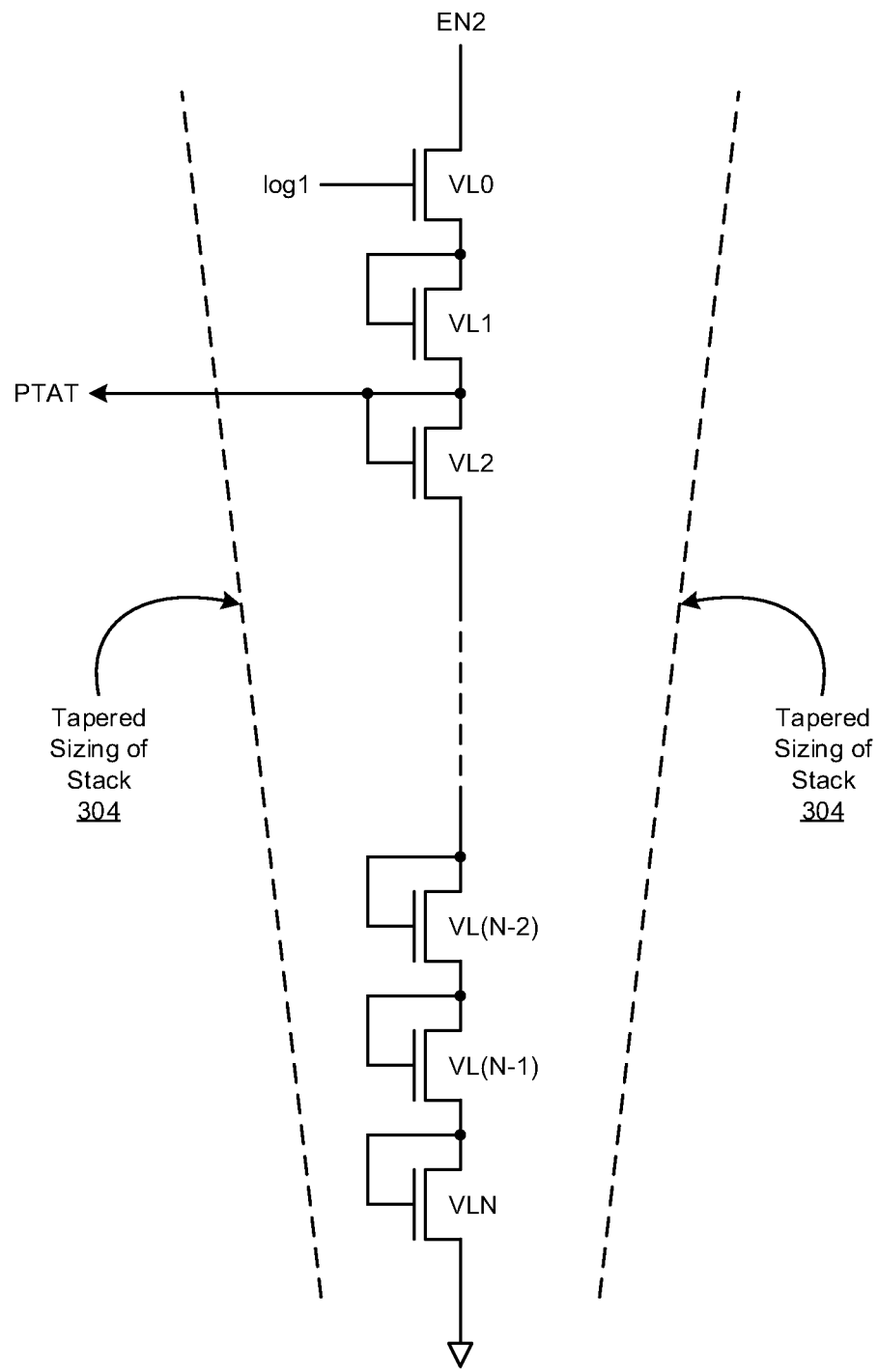
FIG. 3 illustrates a diagram of other voltage generation circuitry in accordance with various implementations described herein.

FIG. 3 illustrates a diagram of the second voltage generation circuitry (VGC) 134 in accordance with various implementations described herein.

As shown in FIG. 3, the second voltage generation circuitry (VGC) 134 may include a chain of variable length devices (VL0, VL1, VL2, . . . , VLN) that are arranged and configured to provide the temperature-compensated voltage (PTAT), which refers to the proportional to absolute temperature voltage (PTAT). In some instances, the chain of variable length devices (VL0, VL1, VL2, . . . , VLN) have variable width (or variable sizing) that tapers (or has tapered sizing) 304 from a greater width device (VL0) to a lessor width device (VLN) along with a number (N) of intermediate width devices (e.g., VL1, VL2, . . . , VL(N−2), VL(N−1)) that are coupled between the greater width device (VL0) and the lessor width device (VLN). The chain of variable width devices (VL0, VL1, VL2, . . . , VL(N−2), VL(N−1), VLN) may include a tapered stack 304 of variable length N-type transistors that are coupled between the enable signal (EN2) and the ground supply (Gnd or Vss). Also, a first transistor (VL0) of the tapered stack 304 of N-type transistors may be activated with a log_1 voltage signal (e.g., >0V), and each of the remaining N-type transistors may be coupled to operate as diodes. In some instances, the temperature-compensated voltage (PTAT) may be taken as an output from a second transistor (VL1) of the tapered stack 304 of N-type transistors.

Figure 4A:
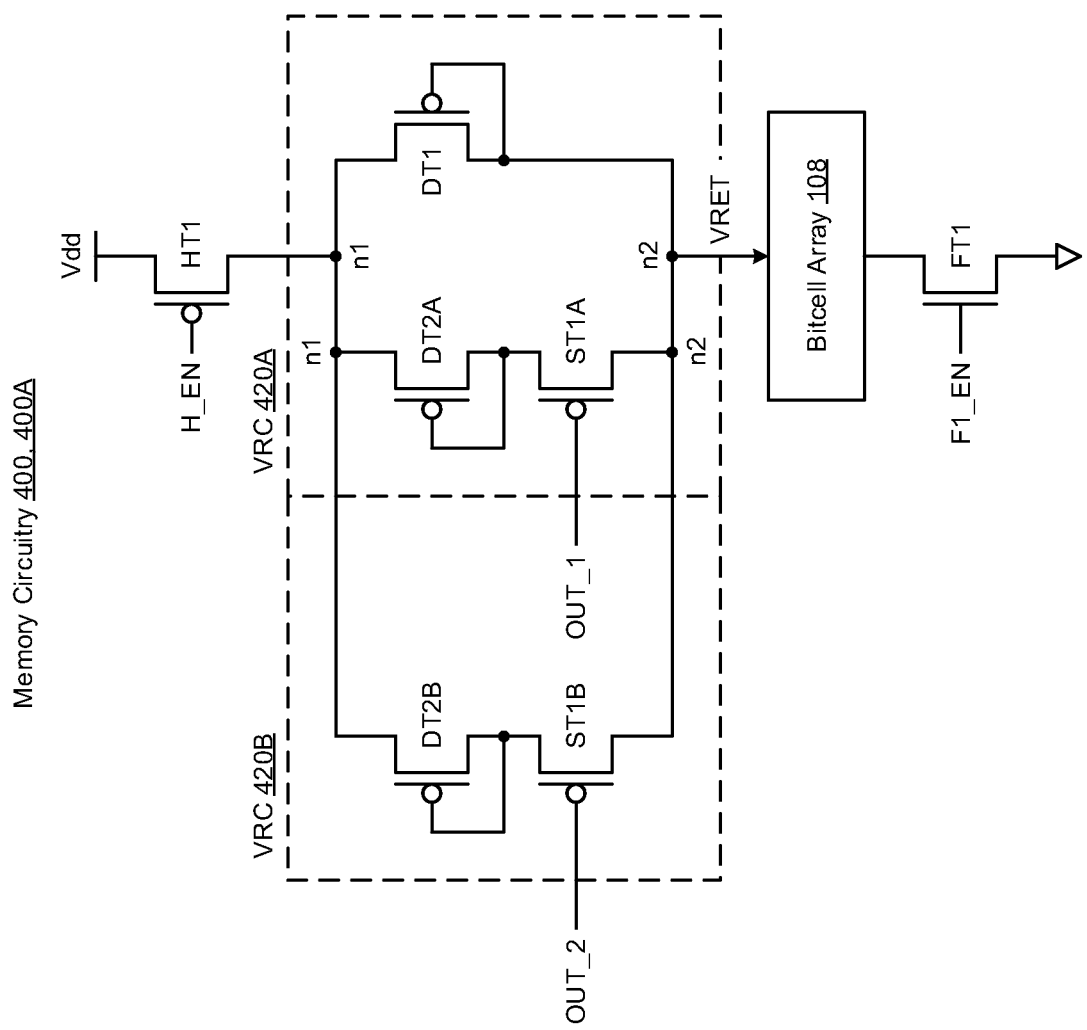
FIGS. 4A-4B illustrate diagrams of memory having voltage retention circuitry in accordance with various implementations described herein.
Figure 4B:
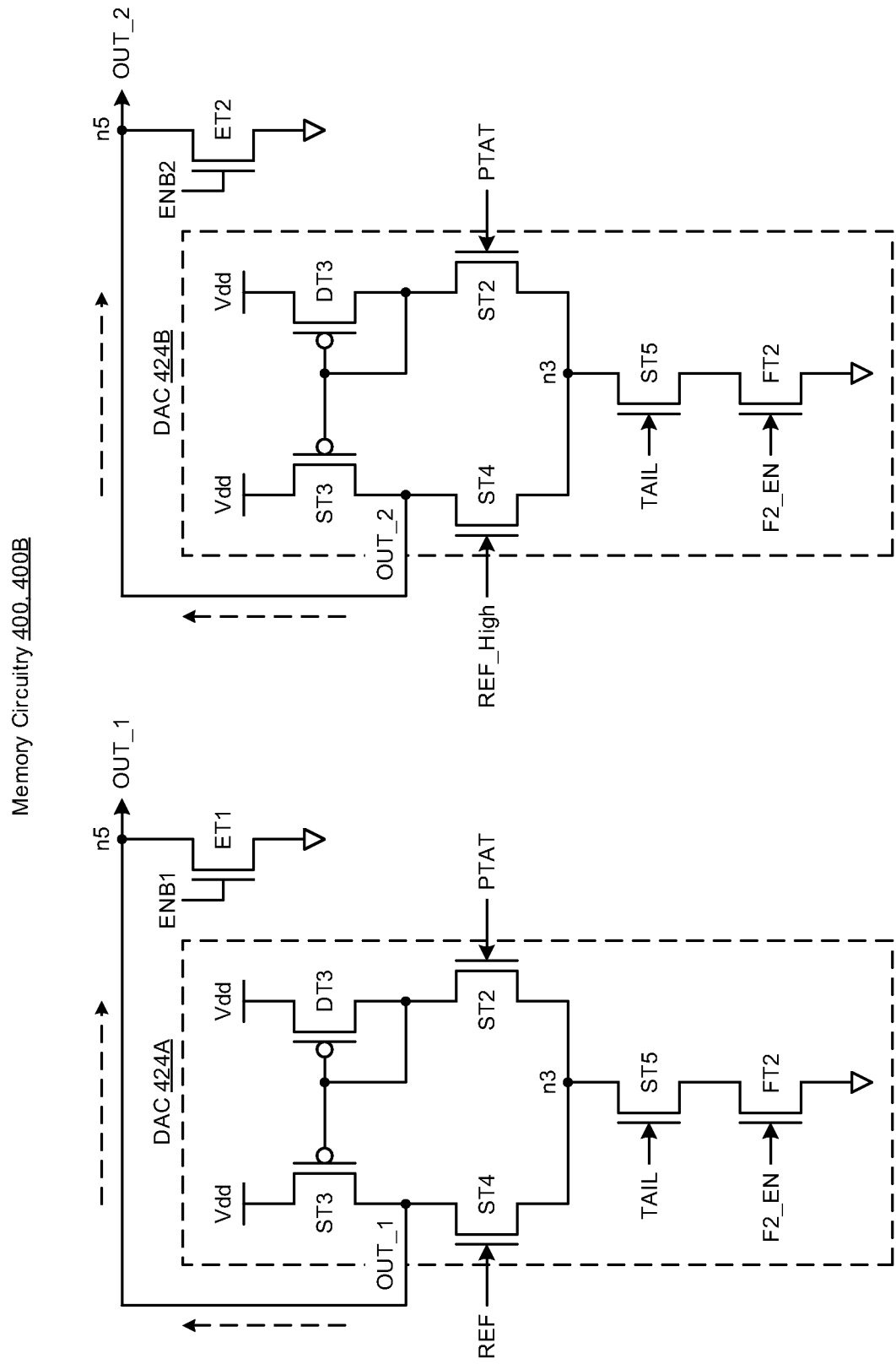

FIGS. 4A-4B illustrate diagrams of memory circuitry 400 with voltage retention circuitry (VRC) 420 and amplifier circuitry 424 in accordance with various implementations described herein. In particular, FIG. 4A shows a diagram 400A of the memory circuitry 400 with voltage retention circuitry (VRC) 420A, 420B, and FIG. 4B shows a diagram 400B of the memory circuitry 400 with amplifier circuitry 424A, 424B. Various devices in FIGS. 4A-4B have similar scope and features to similar devices in FIG. 1.

The memory circuitry 400 may include multiple voltage retention circuits (VRC) 420A, 420B that are configured to receive multiple output voltages (OUT_1, OUT_2) from multiple amplifier circuits 424A, 424B and provide the retention voltage (VRET) to memory 108 based on at least one of the output voltages (OUT_1, OUT_2). In some instances, the voltage retention circuits (VRC) 420A, 420B may include multiple devices, including, e.g., first switch devices (ST1A, ST1B) that may be enabled by the corresponding output voltages (OUT_1, OUT_2) and that may provide the retention voltage (VRET) to memory 108 based on the corresponding output voltages (OUT_1, OUT_2). In various instances, the VRC 120 of FIG. 1 is expandable to include multiple VRCs 420A, 420B as shown in FIG. 4A so as to receive multiple output voltages (OUT_1, OUT_2) and also provide the retention voltage (VRET) based on the output voltages (OUT_1, OUT_2).

In some implementations, the voltage retention circuits (VRC) 420A, 420B may include a first VRC 420A (that is similar to the VRC 120 in FIG. 1) and a second VRC 420B (that includes some devices of the VRC 120 in FIG. 1). The first VRC 420A may include diode devices (DT1, DT2) and the switch device (ST1A). The header device (HT1) may be coupled to the first VRC 420A between the voltage supply source (Vdd) and the diode devices (DT1, DT2) at node (n1), and also, the header device (HT1) may be implemented with a P-type transistor that is activated by the header enable signal (H_EN). The diode device (DT1) may be coupled between the header device (HT1) at node (n1) and the bitcell array 108 at node (n2), and the diode device (DT1) may be implemented with a P-type transistor that is coupled as a diode. The diode device (DT2A) may be coupled between the header device (HT1) at node (n1) and the switch device (ST1A), and also, the diode device (DT2A) may be implemented with a P-type transistor that is coupled as a diode. The switch device (ST1A) may be coupled between the diode device (DT2A) and bitcell array 108 at node (n2), and the switch device (ST1A) may be implemented with a P-type transistor that is activated with a first output voltage (OUT_1) as provided by the amplifier circuitry 424A. The bitcell array 108 may be coupled between the switch device (ST1A) at node (n2) and the footer device (FT1). The footer device (FT1) may be coupled between the bitcell array 108 and the ground supply (Gnd or Vss), and the footer device (FT1) may be implemented with an N-type transistor that is activated by a first footer enable signal (F1_EN).

Further, as shown in FIG. 4A, the second VRC 420B may include the diode device (DT2B) and the switch device (ST1B). The diode device (DT2B) may be coupled between the header device (HT1) at node (n1) and the switch device (ST1B), and the diode device (DT2B) may be implemented with a P-type transistor that is coupled as a diode. The switch device (ST1B) may be coupled between the diode device (DT2B) and the bitcell array 108 at node (n2), and the switch device (ST1B) may be implemented with a P-type transistor that is activated with a second output voltage (OUT_2) as provided by the amplifier circuitry 424B. Thus, in various instances, the VRC 120 of FIG. 1 may be expandable to include multiple VRCs 420A, 420B as shown in FIG. 4A so as to receive multiple output voltages (OUT_1, OUT_2) and also provide the retention voltage (VRET) based on at least one of the output voltages (OUT_1, OUT_2).

Also, as shown in FIG. 4B, the amplifier circuits 424A, 424B may be adapted to operate as differential amplifier circuits (DAC), and the DACs 424A, 424B may include multiple devices that are arranged and adapted to assist with providing the multiple output voltages (OUT_1, OUT_2). In some instances, the amplifier circuits may include a first DAC 424A that provides the first output voltage (OUT_1), and the amplifier circuits may include a second DAC 424B that provides the second output voltage (OUT_2). As shown, each of the DACs 424A, 424B may include the diode device (DT3), switch devices (ST2, ST3, ST4, ST5), and the footer device (FT2). The diode device (DT3) is coupled between the voltage supply source (Vdd) and the switch device (ST2), and the diode device (DT3) may be implemented with a P-type transistor coupled as a diode. The switch device (ST2) is coupled between the diode device (DT3) and the switch device (ST5) at node (n3), and the switch device (ST2) may be implemented with an N-type transistor that is activated by the PTAT voltage provided by the second VGC 134. The switch device (ST3) is coupled between the voltage supply source (Vdd) and the switch device (ST4) at node (n4), and the third switch device (ST3) may be implemented with a P-type transistor that is activated by the output of the diode device (DT3). The switch device (ST4) is coupled between the switch device (ST3) at node (n4) and the switch device (ST5) at node (n3), and the switch device (ST4) may be implemented with an N-type transistor that is activated by the REF voltage provided by the first VGC 130. The switch device (ST5) is coupled between the switch device (ST2) at node (n3) and the footer device (FT2), and the switch device (ST5) may be implemented with an N-type transistor that is activated by the TAIL voltage, which is provided by the first VGC 130. The footer device (FT2) is coupled between the switch device (ST5) and ground (Gnd or Vss), and the footer device (FT2) may be implemented with an N-type transistor that is activated by the footer enable signal (F2_EN).

In some implementations, the memory circuitry 400 may include multiple enable devices (ET1, ET2) that are coupled between each of the DACs 424A, 424B and the VRCs 420A, 420B. The output signals from the DACs 424A, 424B may be coupled directly to the inputs of the corresponding VRCs 420A, 420B at gates of the switch devices (ST1A, ST1B). Also, the multiple enable devices (ET1, ET2) are coupled between the output nodes of DACs 424A, 424B and ground (Gnd or Vss), and the multiple enable devices (ET1, ET2) may be implemented with N-type transistors activated by corresponding enable signals (ENB1, ENB2). As such, the output voltages (OUT_1, OUT_2) may be provided by the multiple DACs 424A, 424B to the enable transistors (ET1, ET2) and also to the VRCs 420A, 420B.

Figure 5A:
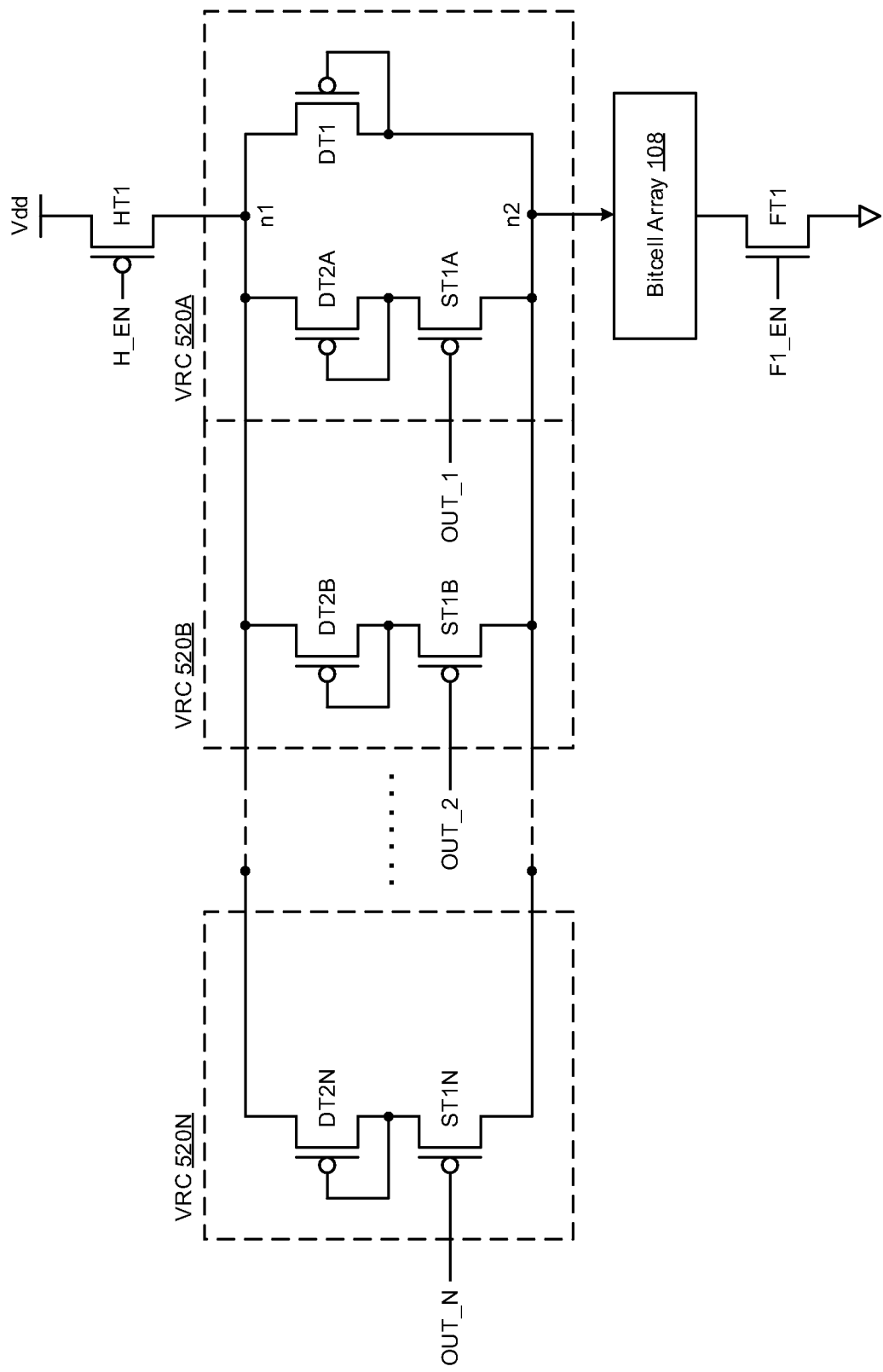
FIGS. 5A-5B illustrate diagrams of memory having voltage retention circuitry in accordance with various implementations described herein.
Figure 5B:
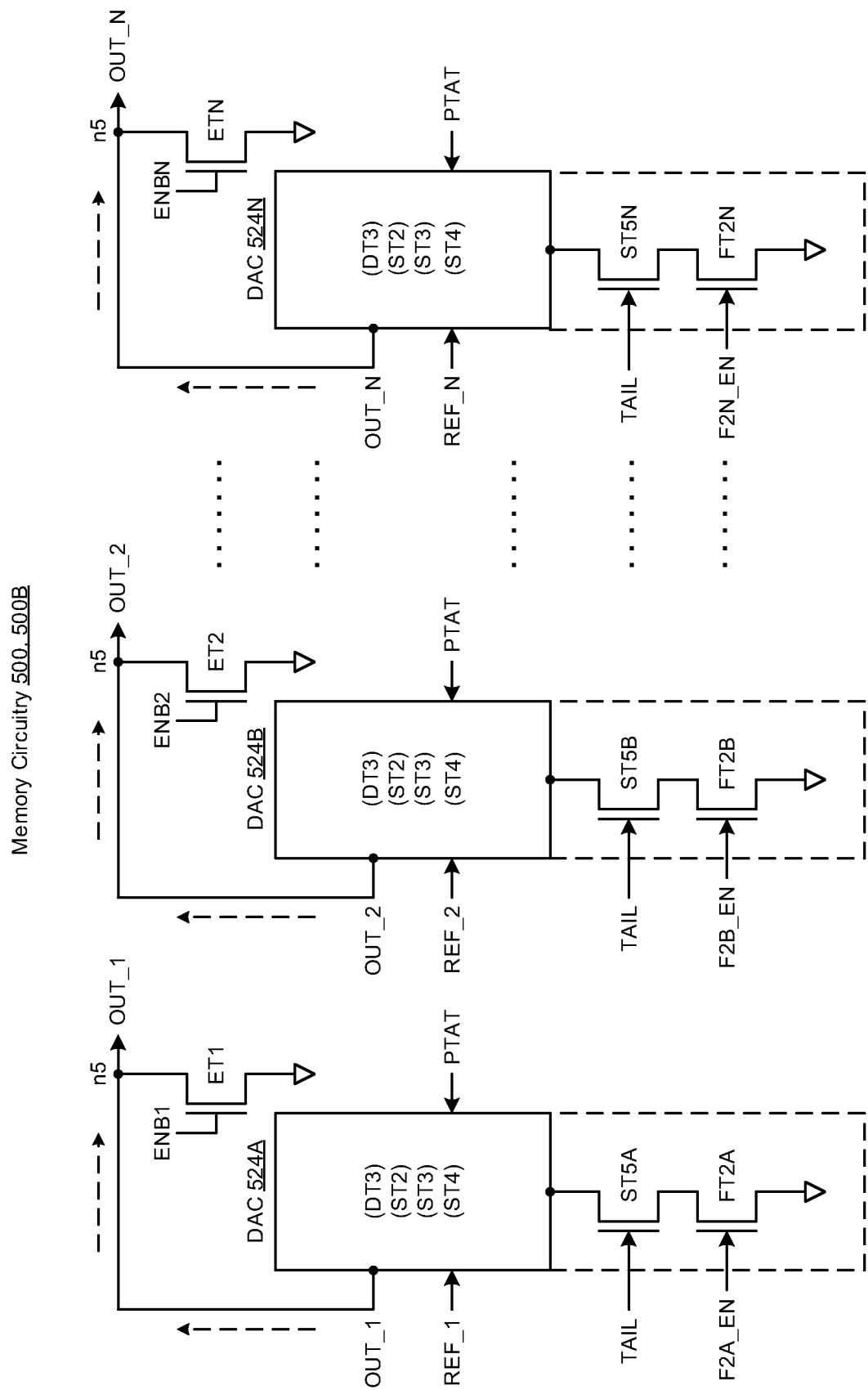

FIGS. 5A-5B illustrate diagrams of memory circuitry 500 with voltage retention circuitry (VRC) 520 and amplifier circuitry 524 in accordance with various implementations described herein. In particular, FIG. 5A shows a diagram 500A of the memory circuitry 500 with multiple voltage retention circuits (VRC) 520A, 520B, . . . , 520N, and also, FIG. 5B shows a diagram 500B of the memory circuitry 500 with multiple differential amplifier circuits (DAC) 524A, 524B, . . . , 524N. The various circuit devices in FIGS. 5A-5B have similar scope and features to similar circuit devices in FIGS. 1 and 4A-4B.

The memory circuitry 500 may include multiple voltage retention circuits (VRC) 520A, 520B, . . . , 520N that are configured to receive the corresponding output voltages (OUT_1, OUT_2, . . . , OUT_N) from multiple amplifier circuits 524A, 524B, . . . , 524N and provide the retention voltage (VRET) to memory 108 based on at least one of the output voltages (OUT_1, OUT_2, . . . , OUT_N). In some instances, the voltage retention circuits (VRC) 520A, 520B, . . . , 520N may include multiple devices, including, e.g., switch devices (ST1A, ST1B) that are enabled by the corresponding output voltages (OUT_1, OUT_2, . . . , OUT_N) and that may provide the retention voltage (VRET) to memory 108 based on the corresponding output voltages (OUT_1, OUT_2, ..., OUT_N). In various instances, the VRC 120 of FIG. 1 is expandable to include multiple VRCs 520A, 520B, ..., 520N as shown in FIG. 5A to receive the corresponding output voltages (OUT_1, OUT_2, ..., OUT_N) and also provide the retention voltage (VRET) based on the corresponding output voltages (OUT_1, OUT_2, ..., OUT_N).

In some implementations, the voltage retention circuits (VRC) 520A, 520B, ..., 520N may be similar to the VRC 120 in FIG. 1. The VRCs 520A, 520B, ..., 520N may include diode devices (DT1, DT2A, DTB, ..., DT2N) and the switch devices (ST1A, ST1B, ..., ST1N). The header device (HT1) may be coupled to the VRC 520A between the voltage supply source (Vdd) and the diode devices (DT1, DT2A, DTB, ..., DT2N) at node (n1), and the header device (HT1) may be implemented with a P-type transistor activated by the header enable signal (H_EN). The diode device (DT1) may be coupled between the header device (HT1) at node (n1) and the bitcell array 108 at node (n2), and the diode device (DT1) may be implemented with a P-type transistor that is coupled as a diode. Also, the diode devices (DT2A, DT2B, ..., DT2N) may be coupled between the header device (HT1) at node (n1) and the switch devices (ST1A, ST1B, ..., ST1N), and the diode devices (DT2A, DT2B, ..., DT2N) may be implemented with P-type transistors that are coupled as diodes. The switch devices (ST1A, ST1B, ..., ST1N) may be coupled between the diode devices (DT2A, DT2B, ..., DT2N) and bitcell array 108 at node (n2), and the switch device (ST1A, ST1B, ..., ST1N) may be implemented with P-type transistors activated with corresponding output voltages (OUT_1, OUT_2, ..., OUT_N) as provided by the corresponding DACs 524A, 524B, ..., 524N. The bitcell array 108 may be coupled between the switch devices (ST1A, ST1B, ..., ST1N) at node (n2) and the footer device (FT1). In addition, the footer device (FT1) may be coupled between the bitcell array 108 and the ground supply (Gnd or Vss), and the footer device (FT1) may be implemented with an N-type transistor that is activated by the first footer enable signal (F1_EN).

Also, as shown in FIG. 5B, the amplifier circuits 524A, 524B, ..., 524N may be adapted to operate as differential amplifier circuits (DAC), and the DACs 524A, 524B, ..., 524N may include multiple devices arranged and adapted to assist with providing the multiple output voltages (OUT_1, OUT_2, ..., OUT_N). Each of the DACs 524A, 524B, ..., 524N may include the diode device (DT3), switch devices (ST2, ST3, ST4, ST5A, ST5B, ..., ST5N), and the footer devices (FT2A, FT2B, ..., FT2N). The diode device (DT3) is coupled between the voltage supply source (Vdd) and the switch device (ST2), and the diode device (DT3) may be implemented with a P-type transistor coupled as a diode. The switch device (ST2) is coupled between the diode device (DT3) and the switch devices (ST5A, ST5B, ..., ST5N), and the switch device (ST2) may be implemented with an N-type transistor that is activated by the PTAT voltage, which is provided by the second VGC 134. The switch device (ST3) is coupled between the voltage supply source (Vdd) and the switch device (ST4), and the third switch device (ST3) may be implemented with a P-type transistor that is activated by output of the diode device (DT3). The switch device (ST4) is coupled between the switch device (ST3) and the switch devices (ST5A, ST5B, ..., ST5N), and also, each of the switch devices (ST4) may be implemented with N-type transistors that are activated by corresponding references voltages (REF_1, REF_2, ..., REF_N) provided by the first VGC 130. The switch devices (ST5A, ST5B, ..., ST5N) are coupled between the switch device (ST2) and the footer device (FT2), and also, the switch devices (ST5A, ST5B, ..., ST5N) may be implemented with N-type transistors that are activated by the TAIL voltage provided by the first VGC 130. The footer device (FT2) is coupled between the switch devices (ST5A, ST5B, ..., ST5N) and ground (Gnd or Vss), and the footer device (FT2) may be implemented with an N-type transistor that is activated by the footer enable signal (F2_EN).

In some implementations, the memory circuitry 500 may include multiple enable devices (ET1, ET2, ..., ETN) that are coupled between each of the DACs 524A, 524B, ..., 524N and the VRCs 520A, 520B, ..., 520N. The output signals from the DACs 524A, 524B, ..., 524N may be coupled directly to inputs of corresponding VRCs 520A, 520B, ..., 520N at gates of the switch devices (ST1A, ST1B, ..., ST1N). Also, in some instances, the multiple enable devices (ET1, ET2, ..., ETN) may be coupled between the output nodes of DACs 524A, 524B, ..., 524N and ground (Gnd or Vss), and the multiple enable devices (ET1, ET2, ..., ETN) may be implemented with N-type transistors that are activated by corresponding enable signals (ENB1, ENB2, ..., ENBN). In addition, the output voltages (OUT_1, OUT_2, ..., OUT_N) are provided by the multiple DACs 524A, 524B, ..., 524N to the enable transistors (ET1, ET2, ..., ETN) and also to the VRCs 520A, 520B, ..., 520N.

In some implementations, in reference to FIGS. 5A-5B, the memory circuitry 500 may refer to a system having the first voltage generator 130 (of FIG. 1) that provides the one or more reference voltages (REF_1, REF_2, ..., REF_N) and the second voltage generator 134 (of FIG. 1) that provides the temperature-compensated voltage, which refers to the proportional to absolute temperature voltage (PTAT). The memory circuitry 500 may include the one or more amplifier stages (DACs 524A, 524B, ..., 524N) that receive the one or more reference voltages (REF_1, REF_2, ..., REF_N) from the first voltage generator 130 (FIG. 2C), receive the temperature-compensated voltage (PTAT) from the second voltage generator 134, and also provide the one or more output voltages (OUT_1, OUT_2, ..., OUT_N) based on the one or more reference voltages (REF_1, REF_2, ..., REF_N) and the temperature-compensated voltage (PTAT). The memory circuitry 500 may include one or more voltage retention stages (VRCs 520A, 520B, ..., 520N) that receive the one or more output voltages (OUT_1, OUT_2, ..., OUT_N) from the one or more amplifier stages (DACs 524A, 524B, ..., 524N) and provide the retention voltage (VRET) to the memory bitcell array 108 based on the one or more output voltages (OUT_1, OUT_2, ..., OUT_N).

In some instances, the first voltage generator 130 may include a chain of fixed length devices that are configured to provide the one or more reference voltages (REF_1, REF_2, ..., REF_N) along with the tail voltage (TAIL). The one or more amplifier stages (DACs 524A, 524B, ..., 524N) may receive the one or more reference voltages (REF_1, REF_2, ..., REF_N) from the chain of fixed length devices and provide the one or more output voltages (OUT_1, OUT_2, ..., OUT_N) based on the temperature-compensated voltage (PTAT), the one or more reference voltages (REF_1, REF_2, ..., REF_N), and/or the tail voltage (TAIL). The one or more amplifier stages (DACs 524A, 524B, ..., 524N) refer to one or more differential amplifiers having multiple devices including first devices enabled by the temperature-compensated voltage (PTAT), second devices enabled by the one or more reference voltages (REF_1, REF_2, ..., REF_N), and also, third devices enabled by the tail voltage (TAIL). Also, in some instances, the first devices, the second devices, and the third devices may be arranged and configured to provide the one or more output voltages (OUT_1, OUT_2, ..., OUT_N), e.g., when enabled by the temperature-compensated voltage (PTAT), the one or more reference voltages (REF_1, REF_2, ..., REF_N), and/or the tail voltage (TAIL).

In some instances, the second voltage generator 134 may include a chain of large length devices that may be configured to provide the temperature-compensated voltage (PTAT), and the chain of large length devices may have variable sizing that tapers from a greater width device to a lessor width device with a number of intermediate width devices that are coupled between the greater width device and the lessor width device. The temperature-compensated voltage provided by the chain of variable length devices may refer to a proportional to absolute temperature voltage (PTAT). In addition, the one or more voltage retention stages (VRCs 520A, 520B, ..., 520N) may have multiple devices including switch devices enabled by the one or more output voltages (OUT_1, OUT_2, ..., OUT_N) and provide the retention voltage (VRET) to the memory bitcell array 108 based on the one or more output voltages (OUT_1, OUT_2, ..., OUT_N). In some instances, the memory bitcell array 108 refers to static random access memory (SRAM) having an array of SRAM bitcells.

Figure 6:
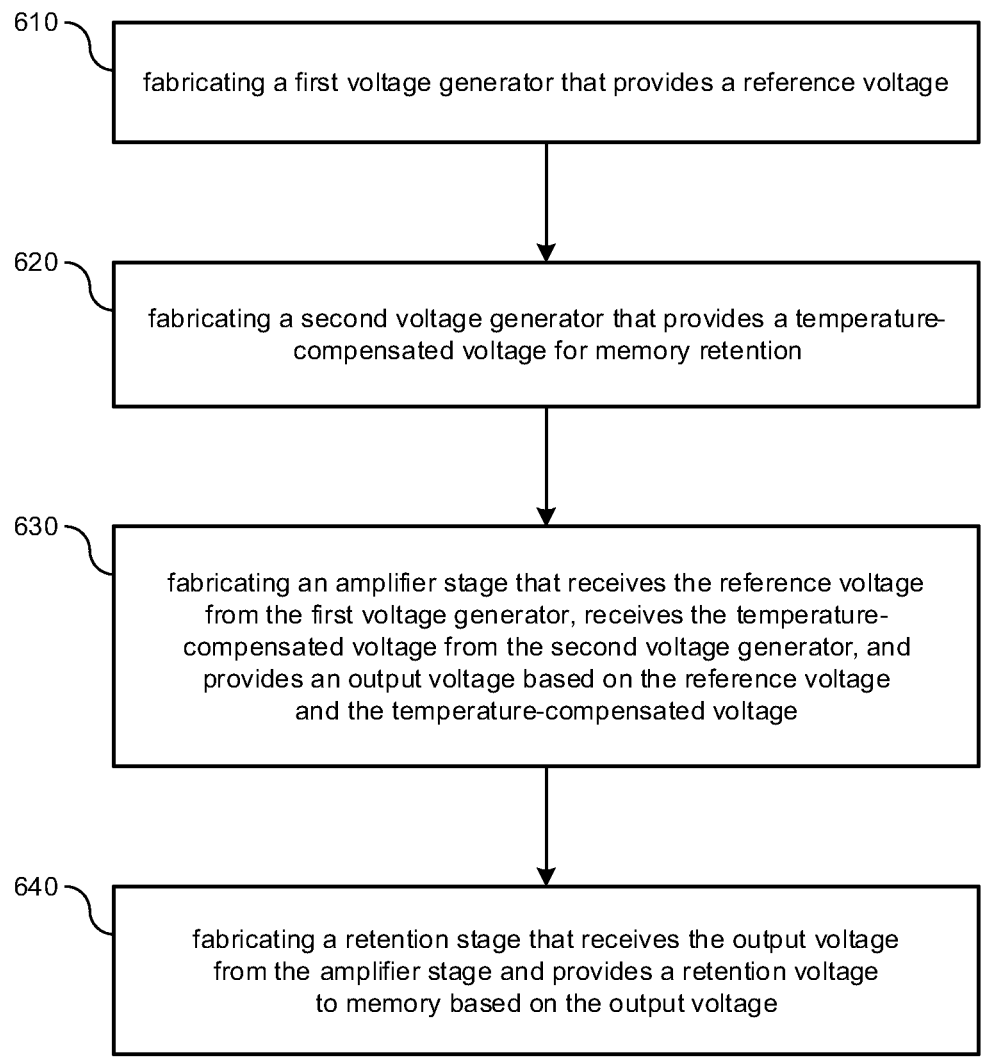
FIG. 6 illustrates a process flow diagram of a method for providing voltage retention circuitry in accordance with various implementations described herein.

FIG. 6 illustrates a process flow diagram of a method 600 for providing voltage retention circuitry in accordance with various implementations described herein.

It should be understood that even though method 600 indicates a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5B. Also, if implemented in software, method 600 may be implemented as a program and/or software instruction process configured for providing voltage retention schemes and techniques, as described herein. Also, if implemented in software, instructions related to implementing the method 600 may be stored in memory and/or a database. For instance, a computer or various other types of computing devices having a processor and memory may be configured to perform method 600.

In various implementations, method 600 may refer to a method of designing, providing, building and/or manufacturing voltage retention circuitry (VRC) as an integrated system, device and/or circuit that may involve use of the various IC circuit components described herein so as to thereby implement voltage retention schemes and techniques associated therewith. Also, the voltage retention circuitry (VRC) may be integrated with computing circuitry and related components on a single chip, and the voltage retention circuitry (VRC) may be implemented in various embedded systems for various electronic, mobile and Internet-of-things (IoT) applications, including sensor nodes.

At block 610, method 600 may fabricate a first voltage generator that provides a reference voltage. The first voltage generator may have a chain of fixed length devices that are configured to provide the reference voltage. Also, at block 620, method 600 may fabricate a second voltage generator that provides a temperature-compensated voltage for memory retention. The second voltage generator may have a chain of variable length devices that are configured to provide the temperature-compensated voltage. In some instances, the temperature-compensated voltage provided by the chain of variable length devices refers to a proportional to absolute temperature (PTAT) voltage.

At block 630, method 600 may fabricate an amplifier stage that receives the reference voltage from the first voltage generator, receives the temperature-compensated voltage from the second voltage generator, and provides an output voltage based on the reference voltage and the temperature-compensated voltage. Also, at block 640, method 600 may fabricate a retention stage that receives the output voltage from the amplifier stage and provides a retention voltage to memory based on the output voltage. In some instances, the memory may refer to SRAM having an array of SRAM bitcells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include voltage generator circuitry that provides a temperature-compensated voltage. The device may include amplifier circuitry that receives the temperature-compensated voltage from the voltage generator circuitry and provides an output voltage based on the temperature-compensated voltage. The device may include voltage retention circuitry that receives the output voltage from the amplifier circuitry and provides a retention voltage to memory based on the output voltage.

Described herein are various implementations of a system. The system may include a first voltage generator that provides one or more reference voltages. The system may include a second voltage generator that provides a temperature-compensated voltage. The system may include one or more amplifier stages that receive the one or more reference voltages from the first voltage generator, receive the temperature-compensated voltage from the second voltage generator, and provide one or more output voltages based on the one or more reference voltages and the temperature-compensated voltage. The system may include one or more voltage retention stages that receive the one or more output voltages from the one or more amplifier stages and provide a retention voltage to memory based on the one or more output voltages.

Described herein are various implementations of a method for manufacturing an integrated circuit. The method may include fabricating a first voltage generator that provides a reference voltage. The method may include fabricating a second voltage generator that provides a temperature-compensated voltage for memory retention. The method may include fabricating an amplifier stage that receives the reference voltage from the first voltage generator, receives the temperature-compensated voltage from the second voltage generator, and provides an output voltage based on the reference voltage and the temperature-compensated voltage. The method may include fabricating a retention stage that receives the output voltage from the amplifier stage and provides a retention voltage to memory based on the output voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   voltage generator circuitry comprising a chain of devices that provide a reference voltage and a temperature-compensated voltage, wherein a chain of fixed length devices of the chain of devices is arranged and configured to provide the reference voltage;
   amplifier circuitry that receives the temperature-compensated voltage and the reference voltage from the voltage generator circuitry and provides an output voltage based on the temperature-compensated voltage and the reference voltage; and
   voltage retention circuitry that receives the output voltage from the amplifier circuitry and provides a retention voltage to memory based on the output voltage.

2. The device of claim 1, wherein the memory refers to static random access memory (SRAM) having an array of SRAM bitcells.

3. The device of claim 1, wherein:
   the chain of fixed length devices is configured to provide a tail voltage, and
   the amplifier circuitry receives the tail voltage from the chain of fixed length devices and provides the output voltage based on the temperature-compensated voltage, the reference voltage, and the tail voltage.

4. The device of claim 3, wherein the amplifier circuitry refers to a differential amplifier having multiple devices including a first device enabled by the temperature-compensated voltage, a second device enabled by the reference voltage, and a third device enabled by the tail voltage.

5. The device of claim 4, wherein the first device, the second device, and the third device are arranged and configured to provide the output voltage when enabled by the temperature-compensated voltage, the reference voltage, and the tail voltage.

6. A device, comprising:
   voltage generator circuitry comprising a chain of devices that provides a temperature-compensated voltage;
   amplifier circuitry that receives the temperature-compensated voltage from the voltage generator circuitry and provides an output voltage based on the temperature-compensated voltage; and
   voltage retention circuitry that receives the output voltage from the amplifier circuitry and provides a retention voltage to memory based on the output voltage, wherein the chain of devices of the voltage generator circuitry comprises a chain of variable length devices that is arranged and configured to provide the temperature-compensated voltage.

7. The device of claim 6, wherein the chain of variable length devices has variable width that tapers from a greater width device to a lessor width device with a number of intermediate width devices coupled between the greater width device and the lessor width device.

8. The device of claim 6, wherein the temperature-compensated voltage provided by the chain of variable length devices refers to a proportional to absolute temperature (PTAT) voltage.

9. A device, comprising:
   voltage generator circuitry that provides a temperature-compensated voltage;
   amplifier circuitry that receives the temperature-compensated voltage from the voltage generator circuitry and provides an output voltage based on the temperature-compensated voltage; and
   voltage retention circuitry that receives the output voltage from the amplifier circuitry and provides a retention voltage to memory based on the output voltage, wherein the voltage retention circuitry has multiple devices including a switch device enabled by the output voltage and provides the retention voltage to the memory based on the output voltage.

10. A system, comprising:
a first voltage generator comprising a chain of fixed length devices that is configured to provide one or more reference voltages;
a second voltage generator comprising a chain of devices that provide a temperature-compensated voltage;
one or more amplifier stages that receive the one or more reference voltages from the first voltage generator, receive the temperature-compensated voltage from the second voltage generator, and provide one or more output voltages based on the one or more reference voltages and the temperature-compensated voltage; and
one or more voltage retention stages that receive the one or more output voltages from the one or more amplifier stages and provide a retention voltage to memory based on the one or more output voltages.

11. The system of claim 10, wherein:
the first voltage generator is configured to provide the one or more reference voltages and a tail voltage, and
the one or more amplifier stages receive the one or more reference voltages from the chain of fixed length devices and provide the one or more output voltages based on the temperature-compensated voltage, the one or more reference voltages, and the tail voltage.

12. The system of claim 11, wherein the one or more amplifier stages refer to one or more differential amplifiers having multiple devices including first devices enabled by the temperature-compensated voltage, second devices enabled by the one or more reference voltages, and third devices enabled by the tail voltage.

13. The system of claim 12, wherein the first devices, the second devices, and the third devices are arranged and configured to provide the one or more output voltages when enabled by the temperature-compensated voltage, the one or more reference voltages, and the tail voltage.

14. The system of claim 10, wherein the one or more voltage retention stages have multiple devices including switch devices enabled by the one or more output voltages and provide the retention voltage to the memory based on the one or more output voltages.

15. The system of claim 10, wherein the memory refers to static random access memory (SRAM) having an array of SRAM bitcells.

16. A system, comprising:
a first voltage generator that provides one or more reference voltages;
a second voltage generator comprising a chain of devices that provides a temperature-compensated voltage;
one or more amplifier stages that receive the one or more reference voltages from the first voltage generator, receive the temperature-compensated voltage from the second voltage generator, and provide one or more output voltages based on the one or more reference voltages and the temperature-compensated voltage; and
one or more voltage retention stages that receive the one or more output voltages from the one or more amplifier stages and provide a retention voltage to memory based on the one or more output voltages, wherein
the chain of devices of the second voltage generator comprises a chain of variable length devices configured to provide the temperature-compensated voltage.

17. The system of claim 16, wherein the temperature-compensated voltage provided by the chain of variable length devices refers to a proportional to absolute temperature (PTAT) voltage.

18. A method of manufacturing an integrated circuit, comprising:
fabricating a first voltage generator that provides a reference voltage;
fabricating a second voltage generator comprising a chain of variable length devices that provide a temperature-compensated voltage for memory retention;
fabricating an amplifier stage that receives the reference voltage from the first voltage generator, receives the temperature-compensated voltage from the second voltage generator, and provides an output voltage based on the reference voltage and the temperature-compensated voltage; and
fabricating a retention stage that receives the output voltage from the amplifier stage and provides a retention voltage to memory based on the output voltage.

19. The method of claim 18, wherein:
the first voltage generator has a chain of fixed length devices configured to provide the reference voltage,
the temperature-compensated voltage provided by the chain of variable length devices refers to a proportional to absolute temperature (PTAT) voltage; and
the memory refers to static random access memory (SRAM) having an array of SRAM bitcells.

* * * * *